(12) United States Patent
Yang et al.

(10) Patent No.: US 9,360,751 B2
(45) Date of Patent: Jun. 7, 2016

(54) IMPRINTING STAMP AND NANO-IMPRINTING METHOD USING THE SAME

(75) Inventors: Ki-yeon Yang, Seongnam-si (KR); Woong Ko, Hwaseong-si (KR); Jae-kwan Kim, Daejeon (KR); Du-hyun Lee, Suwon-si (KR); Byung-kyu Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 373 days.

(21) Appl. No.: 13/617,874

(22) Filed: Sep. 14, 2012

(65) Prior Publication Data

US 2013/0147096 A1 Jun. 13, 2013

(30) Foreign Application Priority Data

Dec. 13, 2011 (KR) ........................ 10-2011-0134002

(51) Int. Cl.
*G03F 7/00* (2006.01)
*B29C 59/02* (2006.01)
*B82Y 10/00* (2011.01)
*B82Y 40/00* (2011.01)

(52) U.S. Cl.
CPC ............ *G03F 7/0002* (2013.01); *B29C 59/022* (2013.01); *B82Y 10/00* (2013.01); *B82Y 40/00* (2013.01); *Y10S 977/887* (2013.01)

(58) Field of Classification Search
CPC .................... Y10S 977/887; B29C 2059/023; B29C 59/022; B29C 2043/025
See application file for complete search history.

(56) References Cited

U.S. PATENT DOCUMENTS

| 4,343,848 | A | * | 8/1982 | Leonard, Jr. ......... | A61B 19/088 |
| | | | | | 428/156 |
| 5,670,188 | A | * | 9/1997 | May ...................... | B29C 59/022 |
| | | | | | 264/280 |
| 7,575,705 | B2 | * | 8/2009 | Sakurai ................. | B82Y 10/00 |
| | | | | | 264/293 |
| 7,762,186 | B2 | | 7/2010 | Meijer et al. | |
| 7,785,526 | B2 | * | 8/2010 | Voisin ........................... | 264/496 |
| 8,241,543 | B2 | * | 8/2012 | O'Donnell et al. ........... | 264/154 |

(Continued)

FOREIGN PATENT DOCUMENTS

JP 2008227076 A 9/2008
JP 2010080551 A 4/2010

(Continued)

OTHER PUBLICATIONS

Lazzarino, F., C. Gourgon, P. Schiavone, and C. Perret, Mold deformation in nanoimprint lithography, J. of Vac. Sci. & Technol. B, vol. 22, No. 6 (2004), pp. 3318-3322.*

(Continued)

*Primary Examiner* — Matthew Daniels
(74) *Attorney, Agent, or Firm* — Harness, Dickey & Pierce (57) ABSTRACT

An imprinting stamp and a nano-imprinting method using the imprinting stamp are provided. The imprinting stamp includes a first substrate; one or more field regions on the first substrate, the first substrate including nano-patterns; and a first dummy pattern region on the first substrate and adjacent to the field region, the dummy pattern region including first dummy patterns having greater dimensions than that of the nano-patterns, the first dummy patterns being a plurality of polygons, each of the polygons having a vertex pointing in a first direction proceeding from the field region toward the first dummy pattern region.

7 Claims, 7 Drawing Sheets

(56) References Cited

U.S. PATENT DOCUMENTS

| | | | |
|---|---|---|---|
| 2004/0126531 A1* | 7/2004 | Harvey et al. | 428/43 |
| 2004/0151796 A1* | 8/2004 | Boegli | 425/364 R |
| 2004/0192041 A1* | 9/2004 | Jeong | B82Y 10/00 438/689 |
| 2007/0048630 A1* | 3/2007 | Sandhu | 430/5 |
| 2007/0231542 A1* | 10/2007 | Deng et al. | 428/141 |
| 2008/0305940 A1* | 12/2008 | Maida et al. | 501/54 |
| 2010/0096776 A1* | 4/2010 | Xu et al. | 264/293 |

FOREIGN PATENT DOCUMENTS

| | | |
|---|---|---|
| KR | 20020050927 A | 6/2002 |
| KR | 10-2009-0049141 A | 5/2009 |

OTHER PUBLICATIONS

Choi, J., D.S. Nam, B.G. Kim, S.-G. Woo, H.K. Cho, Resist charging effect in photomask: Its impact on pattern placement error and critical dimension, J. of Vac. Sci. & Technol. B, vol. 26, No. 6 (2008), pp. 2345-2350.*

Yoneda et al., "A study of filling process for UV nanoimprint lithography using a fluid simulation," *Proc. of SPIE*, vol. 7271, 7271A, 2009.

Liang et al., "Air bubble formation and dissolution in dispensing nanoimprint lithography," *Nanotechnology*, vol. 18, 025303, 2007.

* cited by examiner

IMPRINTING STAMP AND NANO-IMPRINTING METHOD USING THE SAME

CROSS-REFERENCE TO RELATED APPLICATIONS

This application claims the benefit of Korean Patent Application No. 10-2011-0134002, filed on Dec. 13, 2011, in the Korean Intellectual Property Office, the disclosures of which are incorporated herein in their entirety by reference.

BACKGROUND

1. Field

At least one example embodiment relates to imprinting stamps and/or nano-imprinting methods using the imprinting stamps.

2. Description of the Related Art

Nano-imprint lithography technology is a technology for transferring nano-patterns formed on a surface of a stamp onto an imprinting resist layer by pressing the imprinting resist layer formed on a substrate with the stamp. According to nano-imprint lithography technology, nano-patterns are formed through a direct contact between the stamp and the resist layer. The nano-imprint lithography technology may have two classifications: 1) a thermal nano-imprint lithography; and 2) an ultraviolet (UV) curable nano-imprint lithography technology. In both classifications, nano-patterns are formed according to external energy.

A representative UV curable nano-imprint lithography technology is a step and flash imprint lithography (S-FIL). According to S-FIL technology, UV curable liquid imprinting resin is applied on a substrate, pressed by a transparent stamp, and cured by UV rays.

Research has been recently conducted in order to apply S-FIL technology as a lithography technology for manufacturing semiconductor devices; however, productivity of the S-FIL technology is lower than that of a conventional photo lithography technology, so far. Therefore, in order to use the S-FIL technology in actual industrial field, many kinds of items for improving productivity have been suggested, such as imprinting resin having an improved flexibility and imprinting stamp performing a pressing operation effectively.

SUMMARY

At least one example embodiment provides imprinting stamps adopting dummy patterns capable of improving productivity of a nano-imprinting process, and/or nano-imprinting methods using the imprinting stamp.

Additional aspects will be set forth in part in the description which follows and, in part, will be apparent from the description, or may be learned by practice of example embodiments.

According to an example embodiment, an imprinting stamp includes: a first substrate; a field region on the first substrate, the field region including nano-patterns; and a dummy pattern region on the first substrate adjacent to the field region, the dummy pattern region including dummy patterns having at least one dimension greater than that of the nano-patterns; and the dummy patterns being formed a plurality of polygons, each of the polygons having a vertex pointing in a first direction proceeding from the field region toward the dummy pattern region.

In at least one example embodiment, the first direction may be a direction in which resin flows when the nano-patterns are transferred on the resin.

In at least one example embodiment, if a width of each of the polygons in the first direction is W1 and a width of the polygon in a direction perpendicular to the first direction is W2, then a value of W1/W2 may be greater than 1.

In at least one example embodiment, each of the polygons may have a symmetric shape with respect to the first direction.

In at least one example embodiment, each of the polygons may have at least four corners. In at least one example embodiment, in each of the polygons, an angle between two sides forming the vertex may be less than 90°.

In at least one example embodiment, the field region may include a first field region and a second field region separated from each other in the first direction, and the dummy pattern region may be between the first field region and the second field region.

In at least one example embodiment, the dummy pattern region may include: a first dummy pattern region including a plurality of polygons having a relatively pointed shape arranged in the first direction; and a second dummy pattern region including arrangement of a plurality of polygons having a relatively pointed shape arranged in a second direction that is different from the first direction.

In at least one example embodiment, the field region may include a plurality of field regions that are separated from each other in a form of a two-dimensional array along the first direction and a second direction perpendicular to the first direction, and the dummy pattern region may include a first dummy pattern region including arrangement of a plurality of polygons that are sharp in the first direction, a second dummy pattern region including arrangement of a plurality of polygons that are sharp in the second direction, and a third dummy pattern region including arrangement of a plurality of polygons that are sharp in a third direction that is between the first direction and the second direction.

According to another example embodiment, a nano-imprinting method includes: positioning the imprinting stamp described above on a second substrate, the second substrate having a resin applied thereto, and pressing the imprinting stamp to the second substrate, and irradiating ultraviolet rays to the imprinting stamp.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION OF EXAMPLE EMBODIMENTS

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description. Expressions such as "at least one of," when preceding a list of elements, modify the entire list of elements and do not modify the individual elements of the list.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below," "beneath," "lower," "above," "upper," "on," "between," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIGS. 1A through 1H are diagrams illustrating a nano-imprinting method according to an example embodiment.

Figure 1A:
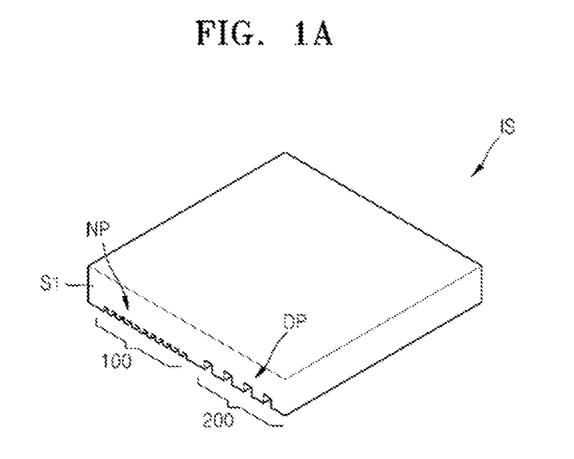
FIGS. 1A through 1H are diagrams illustrating a nano-imprinting method according to an example embodiment.

As shown in FIG. 1A, an imprinting stamp IS is prepared. The imprinting stamp IS includes a field region 100 in which nano-patterns NP that are to be transferred are formed, and a dummy pattern region 200 adjacent to the field region 100, and having dummy patterns DP with at least one dimension (for example, a larger width and/or length) greater than that of the nano-patterns NP, the field region 100 and the dummy pattern region 200 being formed on a first substrate S1.

The imprinting stamp IS is formed by patterning the nano-patterns NP in a surface of the first substrate S1. The nano-patterns may be embossed or engraved on a surface of the first substrate S1. The imprinting stamp IS of an example embodiment further includes the dummy patterns DP having a greater scale than that of the nano-patterns NP, in addition to the nano-patterns NP. The nano-patterns NP and the dummy patterns DP are exemplary and are not limited to the forms shown in FIG. 1. The dummy patterns DP are formed because uniformity of a density of the patterns formed on the surface of the imprinting stamp IS is important when the nano-patterns NP formed on the imprinting stamp IS are transferred by contacting imprinting resin. That is, the dummy patterns DP are formed on a portion where the patterns to be transferred are not formed in order to maintain pattern uniformity of the imprinting stamp IS. The dummy patterns DP may maintain a remaining layer of the imprinted patterns evenly, and reduce pattern defects. Moreover, in an example embodiment, the dummy patterns DP are formed to reduce imprinting defects such as bubble trapping, and thus the imprinting productivity may be improved. A structure of the imprinting stamp IS including the dummy patterns DP will be described with reference to FIGS. 2 through 4.

Figure 1B:
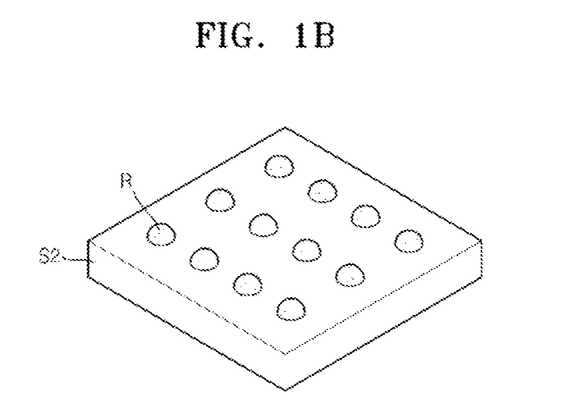

Then, as shown in FIG. 1B, liquid phase resin material R is formed on a second substrate S2. The resin material R may be formed as drops on the second substrate S2 as shown in FIG. 1B.

Figure 1C:
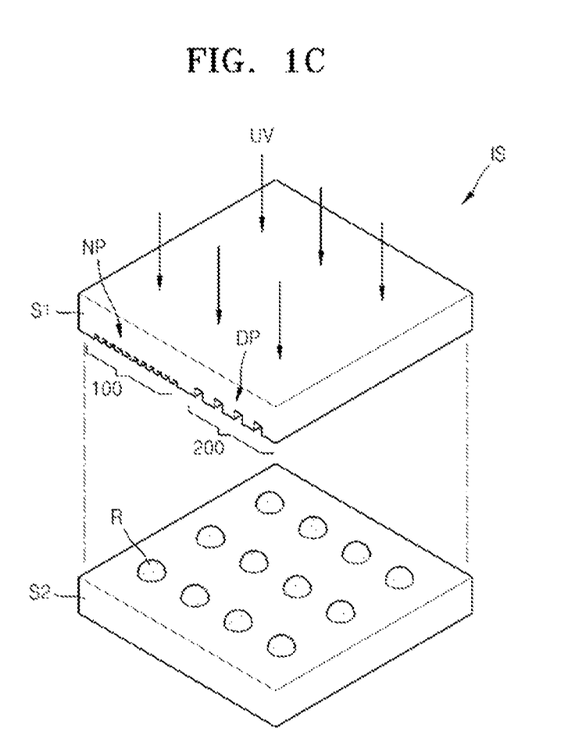
Figure 1D:
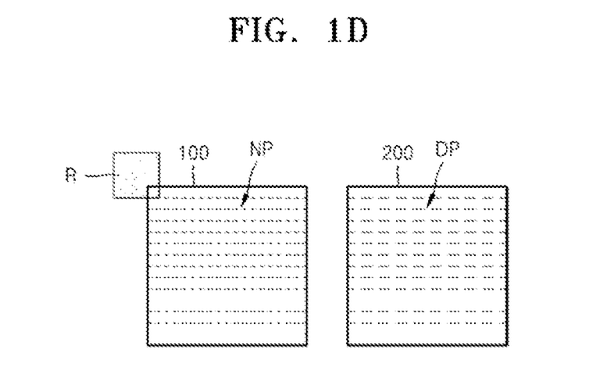
Figure 1E:
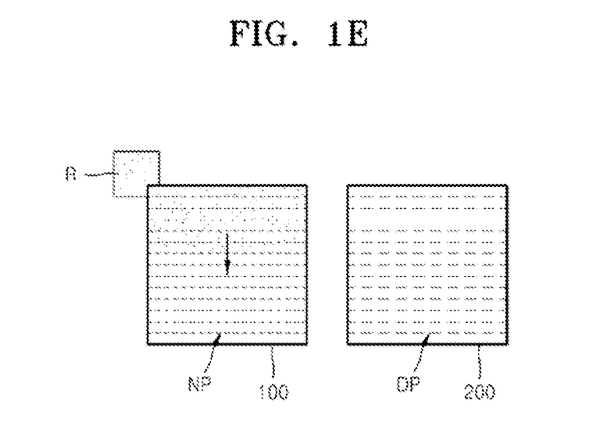
Figure 1F:
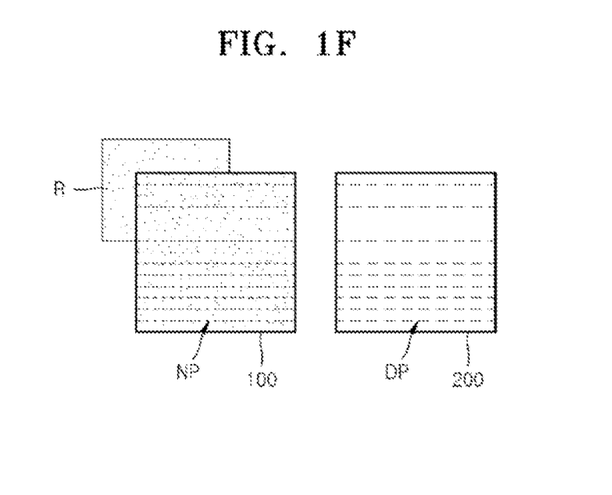

Next, as shown in FIG. 1C, the imprinting stamp IS is positioned on the second substrate S2 on which the liquid phase resin material R is applied and pressed, and then ultraviolet (UV) rays are irradiated onto the imprinting stamp IS. According to the pressing operation, the resin material R spreads to fill the field region 100 and the dummy pattern region 200 of the imprinting stamp IS, and then is cured.

FIGS. 1D through 1G show a flowing direction of fluid when the liquid resin material R fills the field region 100 and the dummy pattern region 200 of the imprinting stamp IS. The resin material R flows in a direction in which the nano-patterns of the field region 100 are filled with the resin material R, and then flows toward the dummy pattern region 200 after completely filling the field region 100, as shown in FIGS. 1D through 1G. Since the resin material R is very flexible at room temperature, defects may occur according to the flow of the resin material R. For example, bubbles (not shown) protruding in a direction in which the resin material R flows may be produced on a side of the nano-pattern. The above phenomenon is referred to as bubble trapping, and the bubbles may be considered as defects during a nano-imprint lithography (NIL) process. In addition, although the bubbles may be melted in the resin material R, it takes a relatively long time to melt the bubbles in the resin material R, and thus a long delay time is generally necessary in order to manufacture an imprinting pattern without these defects.

On the other hand, according to the imprinting stamp IS of an example embodiment, the dummy pattern DP formed in the dummy pattern region 200 has a shape that may minimize bubble trapping. According to the dummy pattern DP of an example embodiment, bubble trapping may be reduced such that time taken to perform the NIL process may also be reduced, which is conventionally difficult due to micro-bubbles. Thus, productivity may be improved using an imprinting stamp IS and/or a nano-imprinting method according to an example embodiment.

Figure 1G:
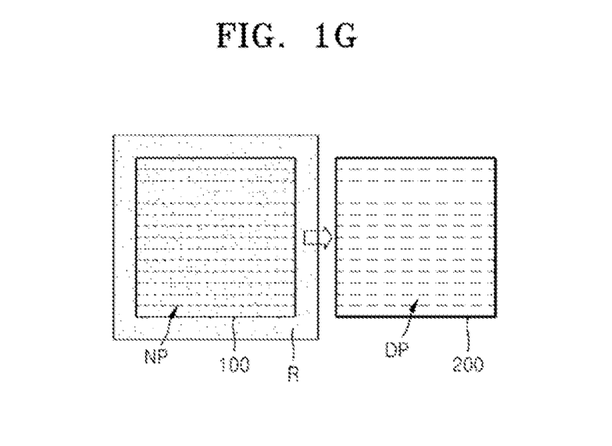
Figure 1H:
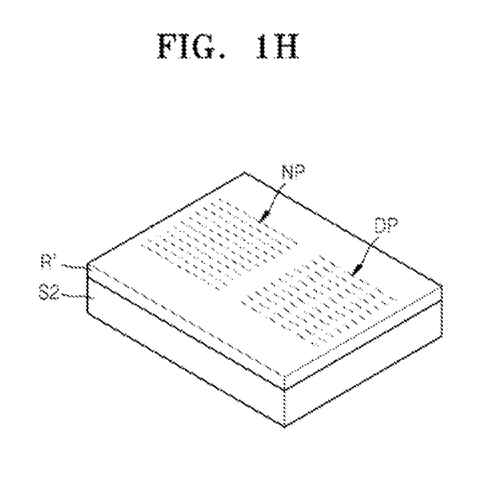

Through the above processes, a resin layer R' is formed to include nano-patterns NP on the second substrate S2.

Figure 2:
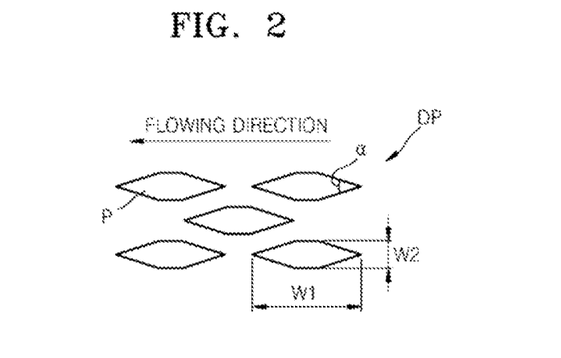
FIG. 2 is a diagram showing a dummy pattern according to an example embodiment.

FIG. 2 is a diagram showing shapes of the dummy patterns DP according to an example embodiment.

The dummy patterns DP include an arrangement of a plurality of polygons P having vertexes pointing in a flowing direction of the resin material during the imprinting process, as shown in FIG. 2. As shown in FIG. 1G illustrating the nano-imprinting process, the resin flows from the field region 100 including the nano-patterns toward the dummy pattern region 200.

If a width of each of the polygons P in a first direction, that is, a flowing direction of the resin, is W1 and a width in a direction perpendicular to the first direction is W2, then a value of W1/W2 may be greater than 1. In addition, as shown in FIG. 2, each of the polygons P may have a symmetric shape with respect to the first direction; however, example embodiments are not limited thereto. The polygon P may have four or more corners, and is not limited to a hexagon shown in FIG. 2. Also, an angle (α) between two sides forming the vertex of the polygon P may be less than 90°.

The dummy pattern DP formed with the plurality of polygons P may reduce bubble trapping, and thus a relatively rapid flow of the resin may be maintained and the productivity of the nano-imprinting process may be improved.

Figure 3:
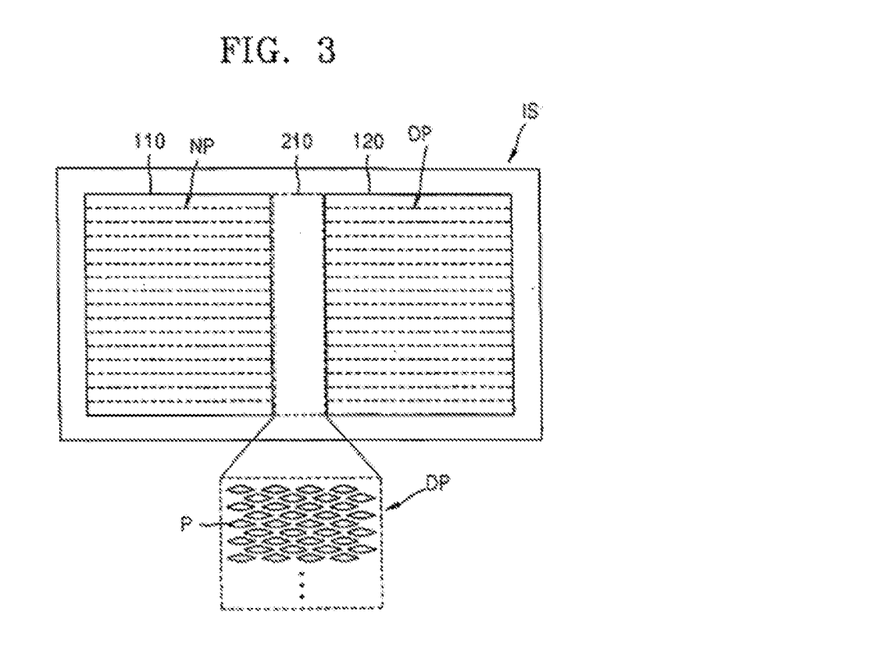
FIG. 3 is a plan view schematically showing an imprinting stamp according to an example embodiment.

FIG. 3 is a schematic plan view of the imprinting stamp IS according to an example embodiment.

The imprinting stamp IS may include one or more field regions, in which the nano-patterns NP are formed, and dummy pattern regions formed between the plurality of field regions. For example, as shown in FIG. 3, the imprinting stamp IS includes a first field region 110 and a second field region 120 that are separated from each other in a direction, and a dummy pattern region 210 in which dummy patterns DP having a greater scale than that of the nano-patterns NP are formed may be disposed between the first and second field regions 110 and 120. The dummy pattern DP is formed by arranging a plurality of polygons P each having a vertex pointing in a direction from the adjacent field region, for example, the first field region 110 toward the dummy pattern region 210. The direction proceeding from the first field region 110 toward the dummy pattern region 210 may be the flowing direction of the resin in the imprinting process. Bubble trapping during the imprinting process may be reduced because the dummy pattern DP including the polygons P having a relatively pointed shape are formed in the flowing direction of the resin.

According to the imprinting stamp IS of FIG. 3, one dummy pattern region 210 is formed; however, the imprinting stamp IS may include one or more filed regions, in which the nano-patterns NP are formed, and a plurality of dummy pattern regions may be disposed between the plurality of field regions. The plurality of dummy pattern regions may include a dummy pattern region including a plurality of polygons having a relatively pointed shape arranged in a desired (or alternatively, predetermined) first direction, and a dummy pattern region including a plurality of polygons having a relatively pointed shape arranged in another desired (or alternatively, predetermined) second direction that is different from the first direction.

Figure 4:
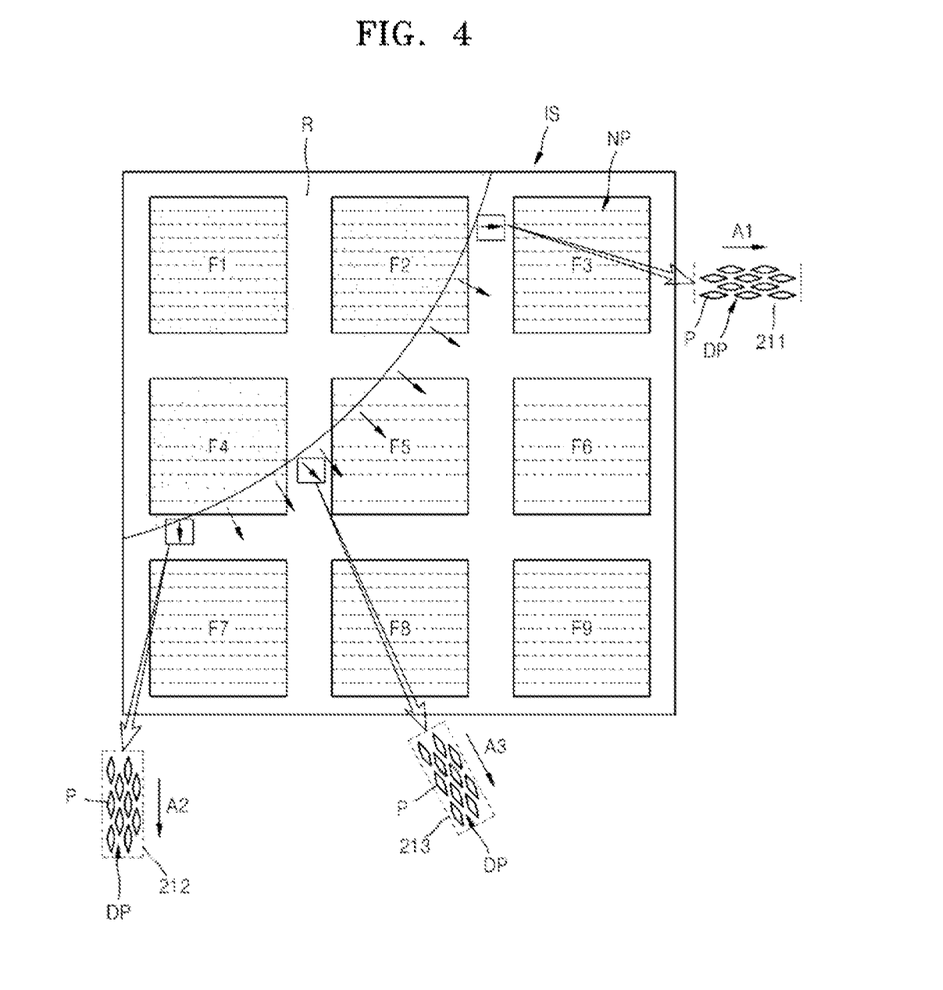
FIG. 4 is a plan view schematically showing an imprinting stamp according to another example embodiment.

FIG. 4 is a plan view of an imprinting stamp IS according to another example embodiment.

The imprinting stamp IS may include a plurality of field regions F1 through F9 that are arranged in a two-dimensional array along two different directions perpendicular to each other, and may include a first dummy pattern region 211 including a plurality of polygons having a relatively pointed shape arranged in a first direction A1, a second dummy pattern region 212 including a plurality of polygons P having a relatively pointed shape arranged in a second direction A2 that is perpendicular to the first direction A1, and a third dummy pattern region 213 including a plurality of polygons P having a relatively pointed shape arranged in a third direction A3 between the first and second directions A1 and A2. In addition to the first through third dummy pattern regions 211, 212, and 213, a plurality of dummy pattern regions may be formed between adjacent field regions F1 through F9. Also, a plurality of polygons forming the dummy patterns may have a relatively pointed shape and may be arranged along the flowing direction of the resin material R as shown in FIG. 4.

In FIG. 4, the polygons of the dummy patterns included in the first through third dummy pattern regions 211, 212, and 213 have the same size as each other; however, example embodiments are not limited thereto, and the polygons may have different sizes from each other according to the flow of fluid.

The above described imprinting stamp adopts the dummy patterns that are formed according to the flowing direction of the imprinting resin, and thus bubble trapping occurring in the nano-imprint process may be reduced.

Therefore, when the nano-imprinting process is performed by using the imprinting stamp including the dummy patterns of at least one example embodiment, the productivity of the nano-imprinting process may be improved.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An imprinting stamp comprising:
   a first substrate;
   a field region on the first substrate, the field region including nano-patterns that are to be transferred to a second substrate; and
   a dummy pattern region on the first substrate adjacent to the field region, the dummy pattern region including dummy patterns having at least one dimension greater than that of the nano-patterns, and the dummy patterns being a plurality of polygons, each of the polygons having at least four corners with respective vertices, the vertices for at least one group of the polygons being oriented in a first common direction,
   wherein a width of each of the polygons in the first common direction is W1, a width of each of the polygons in a direction perpendicular to the first common direction is W2, and a value of W1/W2 is greater than 1.

2. The imprinting stamp of claim 1, wherein each of the polygons has a symmetric shape with respect to the first common direction.

3. The imprinting stamp of claim 1, wherein in each of the polygons, an angle between two sides forming the vertex is less than 90°.

4. The imprinting stamp of claim 1, wherein the field region includes a first field region and a second field region separated from each other in the first common direction, and the dummy pattern region is between the first field region and the second field region.

5. The imprinting stamp of claim 1, wherein the dummy pattern region comprises:
   a first dummy pattern region including a plurality of polygons having respective vertices oriented in the first common direction; and
   a second dummy pattern region including a plurality of polygons having respective vertices oriented in a second common direction that is different from the first common direction.

6. The imprinting stamp of claim 1, wherein
   the field region includes a plurality of field regions separated from each other and in a two-dimensional array along the first common direction and a second common direction perpendicular to the first common direction, and
   the dummy pattern region includes a first dummy pattern region including a plurality of polygons having respective vertices oriented in the first common direction, a second dummy pattern region including a plurality of polygons having respective vertices oriented in the second common direction, and a third dummy pattern region including of a plurality of polygons having respective vertices oriented in a third common direction that is between the first common direction and the second common direction.

7. A nano-imprinting method comprising:

providing an imprinting stamp, the imprinting stamp including, a first substrate, a field region on the first substrate, the field region including nano-patterns that are to be transferred to a second substrate, and   a dummy pattern region on the first substrate adjacent to the field region, the dummy pattern region including dummy patterns having at least one dimension greater than that of the nano-patterns, and the dummy patterns being a plurality of polygons, each of the polygons having at least four corners with respective vertices, the vertices for at least one group of the polygons being oriented in a first common direction, wherein a width of each of the polygons in the first common direction is W1, a width of each of the polygons in a direction perpendicular to the first common direction is W2, and a value of W1/W2 is greater than 1;

positioning the imprinting stamp on the second substrate, the second substrate having a resin applied thereto;

pressing the imprinting stamp to the second substrate; and irradiating ultraviolet rays to the imprinting stamp.

\* \* \* \* \*